United States Patent [19]
Tsang

[11] Patent Number: 5,548,607
[45] Date of Patent: Aug. 20, 1996

[54] ARTICLE COMPRISING AN INTEGRATED LASER/MODULATOR COMBINATION

[75] Inventor: Won-Tien Tsang, Holmdel, N.J.

[73] Assignee: Lucent Technologies, Inc., Murray Hill, N.J.

[21] Appl. No.: 255,589

[22] Filed: Jun. 8, 1994

[51] Int. Cl.$^6$ ................................. H01S 3/18; H01S 3/10
[52] U.S. Cl. ................................. 372/50; 372/26; 372/96; 372/102
[58] Field of Search ................................. 372/26, 28, 50, 372/96, 102, 48

[56] References Cited

U.S. PATENT DOCUMENTS 5,252,839  10/1993  Gouguot ................................. 372/48

FOREIGN PATENT DOCUMENTS

| | | |
|---|---|---|
| 0217384 | 12/1984 | Japan . |
| 0186079 | 9/1985 | Japan . |
| 0168980 | 7/1986 | Japan . |
| 0161786 | 7/1986 | Japan . |

OTHER PUBLICATIONS

"Low Drive Voltage and Extremely Low Chirp Integrated Electroabsorption Modulator/DFB Laser for 2.5 Gibit/s 200 km Normal Fibre Transmission", by M. Aoki et al., *Electronics Letters*, vol. 29, No. 22, 28 Oct. 1993, pp. 1983–1984.

"2.5 ps Soliton Pulse Generation at 15 GHZ with monolithically Integrated MQW–DFB–LD/MQW–EA Modulator and Dispersion Decreasing Fibre", by K. Suzuki et al., *Electronics Letters*, vol. 29, No. 19, 16 Sep. 1993, pp. 1713–1714.

"Packaged, Integrated DBF/EA–MOD for Repeaterless Transmission of 10 Gbit/s Over 107 km Standard Fibre", by P. I. Kuindersma et al., *Electronics Letters*, vol. 29, No. 21, 14 Oct. 1993, pp. 1876–1878.

"A Multi–Section Electroabsorption Modulator Integrated DFB Laser for Optical Pulse Generation and Modulation", by K. Sato et al., *Proceedings of the European Conference on Optical Communications*, 1993, WeC7.2 (No Month Available).

"InGaAs/InGaAsP MQW Electroabsorption Modulator Integrated with a DFB Laser Fabricated by Bank–Gap Energy Control Selective Area MOCVD", by M. Aoki et al., *IEEE Journal of Quantum Electronics*, vol. 29, No. 6, Jun. 1993, pp. 2088–2096.

Primary Examiner—Rodney B. Bovernick
Assistant Examiner—Robert McNutt
Attorney, Agent, or Firm—Eugen E. Pacher

[57] ABSTRACT

The disclosed integrated modulator/laser (I-MOD/DFB) combination comprises an active region that extends the full length of the combination without variation of layer thickness and/or composition. Because of this constancy of the active region parameters the relevant bandgap energy is the same in the laser portion of the combination as in the modulator portion thereof. The combination typically comprises a distributed feedback structure (e.g., a "grating"). In preferred embodiments the feedback structure is selected such that $\lambda_e > \lambda_o$ (typically $\lambda_e - \lambda_o$ in the range 20–70 nm), where $\lambda_e$ is the laser output wavelength, and $\lambda_o$ is the wavelength of the gain peak of the laser medium. The active region can be a bulk active region but preferably is a quantum well active region. Optionally an I-MOD/DFB combination according to the invention can comprise an absorbing region, e.g., an ion implanted region between the laser section and the modulator section. Combinations according to the invention typically are easier to manufacture than prior art combinations, and are advantageously used in e.g., optical fiber communication systems.

8 Claims, 2 Drawing Sheets

ARTICLE COMPRISING AN INTEGRATED LASER/MODULATOR COMBINATION

FIELD OF THE INVENTION

The instant invention pertains to articles that comprise an integrated semiconductor laser/modulator combination.

BACKGROUND OF THE INVENTION

Monolithically integrated modulators (typically electro-absorption modulators) and lasers (typically distributed feedback/distributed Bragg reflector or DFB/DBR lasers) are known, and are expected to be key components of future long haul, high capacity optical fiber communication systems, due to their potentially low chirp and small DC drift, compactness and low drive voltage. Small chirp generally requires that essentially no reflection occurs at the output facet of the combination. Monolithically integrated modulator/laser combinations (I-MOD/DFB) are described, for instance, in M. Aoki et at., *Electronics Letters*, Vol. 29 (22), p. 1983; K. Suzuki et al., *Electronics Letters*, Vol. 29 (19), p. 1713; and P. I. Kuindersma et al., *Electronics Letters*, Vol. 29 (21), p. 1876. K. Sato et al., *Proceedings of the European Conference on Optical Communications*, 1993, weC7.2, disclose an I-MOD/DFB combination that comprises a multisection modulator portion, with a continuous multiquantum-well (MQW) layer extending the length of the combination, and a second MQW layer extending the length of the laser section only.

Prior art I-MOD/DFB combinations typically are designed to have an absorption layer in the modulator section that has a wider bandgap than the laser active medium, in order to avoid excessive absorption by the modulator when the modulator section is unbiased. Thus, the relevant layer or layers of prior art I-MOD/DFB combinations typically exhibits a variation of bandgap energy $E_g$ along the optical axis of the combination. Typically the relevant layer (or layers) is a multi-quantum well (MQW) layer.

Recently it was discovered that the desired axial variation of $E_g$ can be attained by selective area growth by metalorganic vapor phase epitaxy (MOVPE), involving placement of axially oriented dielectric mask stripes on the relevant surface. The technique relies on the observation that in MOVPE the thickness (and typically the composition) of material grown in a region adjacent to a dielectric mask region is a function of the distance from the mask edge, and of the size of the mask region.

This discovery facilitates manufacture of I-MOD/DFB combinations. However, the process of designing and manufacturing such devices is still relatively complicated, requiring determination of the necessary mask geometry, mask formation, and close control of the MOVPE growth. In view of the significant potential of I-MOD/DFB combinations it would be desirable to have available such combinations that can be fabricated more easily, and that optionally can be relatively tolerant of output facet reflection. This application discloses such a I-MOD/DFB combination.

SUMMARY OF THE INVENTION

The invention is embodied in an article that comprises a novel I-MOD/DFB combination that, inter alia, is typically more readily manufacturable than prior art combinations.

More specifically, the article comprises a semiconductor layer structure on a semiconductor substrate. The substrate and layer structure form an integrated device combination that comprises a laser section and a modulator section. The latter is aligned and optically coupled with the former. The article also comprises laser contacts that facilitate flowing an electric current through the laser section, and further comprises modulator contacts that facilitate applying a voltage across the modulator section. The layer structure comprises a first active region (preferably comprising a first quantum well structure) in the laser section and a second active region (preferably comprising a second quantum well structure) in the modulator section. Associated with the first active region is a first bandgap energy $E_{g1}$, and associated with the second active region is a second bandgap energy $E_{g2}$.

Significantly, the first active region is continuous and identical with (i.e., has the same number of layers of essentially the same layer thicknesses and layer compositions as) the second active region, such that $E_{g1} = E_{g2}$. The first and second active regions preferably comprise identical first and second quantum well structures, respectively, but may be identical bulk active regions. The discussion below will be primarily in terms of I-MOD/DFB combinations with quantum well structures, but the invention is not so limited.

The quantum well structure typically, but not necessarily, comprises a multiplicity of (optionally strained) quantum well layers, with a barrier layer between adjacent wells. The device combination typically will also comprise a distributed feedback structure, e.g., a "grating" of predetermined spacing.

In preferred embodiments of the invention the feedback structure is selected such that the lasing mode of the laser has a wavelength $\lambda_e > \lambda_o$, where $\lambda_o$ is the wavelength of the gain-pea of the laser medium. This is to be contrasted with the conventional practice of selecting the feedback structure such that $\lambda_e > \lambda_o$. See, for instance, M. Aoki et al., (op. cit.). The selection of $\lambda_e > \lambda_o$ can result in relatively low optical loss in the modulator section, in the absence of a modulating voltage, since $E_{g1} = E_{g2}$. The feedback structure exemplarily is selected to yield a laser output of wavelength $\lambda_e \sim 1.55$ μm, a wavelength of interest for optical fiber communications.

In a further preferred embodiment optical loss is intentionally introduced in the region between the laser section and the modulator section. The loss can be achieved by any suitable technique (e.g., ion implantation), and serves to provide improved optical isolation of the laser section from light reflected from the output facet of the combination, thereby easing the requirement for substantially zero reflection at the output facet. Except for the above described departures, and changes that necessarily follow therefrom, I-MOD/DFB combinations according to the invention can be conventional.

No attempt has been made to present elements to scale or proportionate.

DETAILED DESCRIPTION

Prior art I-MOD/DFB combinations are exemplified by FIG. 8 of a paper by M. Aoki et al. (*IEEE Journal of Quantum Electronics*, Vol. 29, p. 2088 (1993)). The paper is incorporated herein by reference. As FIG. 8 clearly shows, the MQW structure varies along the optical axis of the combination, with the layer thickness being greater in the laser section than in the modulator section, with the thicknesses typically varying continuously in a transition region. The figure shows that the modulator section is electrically isolated from the laser section by means of a trench filled with Fe-doped InP. Unfilled trenches are also known. As described in the above cited reference, the modulator absorption layer and the laser active layer consist of one continuous InGaAs/InGaAsP MQW structure with different quantum well thicknesses and compositions, resulting in a difference in the value of $E_g$ between modulator and laser.

Figure 1:
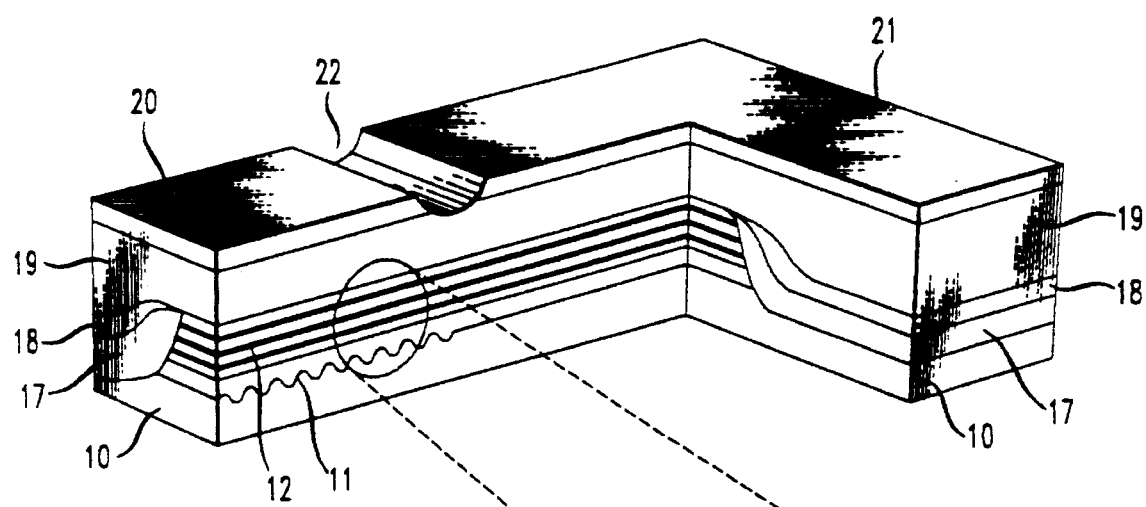
FIG. 1 schematically depicts an exemplary I-MOD/DFB combination according to the invention.
Figure 1B:
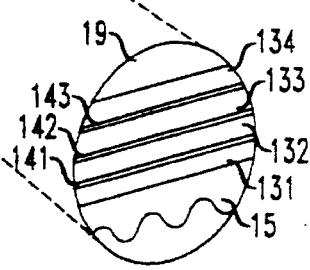

FIG. 1 schematically depicts, in partial cut-away view, relevant aspects of an exemplary I-MOD/DFB combination according to the invention. An appropriate region of substrate 10 (typically n-InP) has a corrugated surface forming grating 11. On both the corrugated and uncorrugated regions of the substrate is formed active region 12, which typically consists of a multiplicity (e.g., five) quantum well layers separated by barrier layers. Optionally the grating can be above the quantum well layers. FIG. 1 shows an enlargement of a portion of the laser section, with a MQW region sandwiched between cladding layers 15 and 19. Numerals 141–143 refer to quantum wells, and numerals 131–134 refer to barrier layers. It will be understood that the figure is schematic and does not necessarily depict all layers of the layer structure.

Exemplarily, the quantum wells each have thickness 5 nm and composition $In_xGa_{1-x}As$ (x selected to give material of bandgap corresponding to $\lambda = 1.65$ µm), and the barrier layers each have thickness 10 nm and composition $In_xGa_{1-x}As_yP_{1-y}$ ($\lambda = 1.15$ µm). It is conventional to specify the composition of ternary and quaternary III/V alloys in terms of an equivalent wavelength. As those skilled in the art will recognize, the layer structure can be readily formed by conventional means, e.g., by MOCVD.

Layer thicknests and layer compositions are constant along the optic axis of the combination. By "constant" I mean that the layer thickness and composition are not varied intentionally. Of course, the parameters may exhibit small departures from true constancy due to substantially unavoidable manufacturing imperfections. It will also be understood that the active region is not necessarily of constant width throughout the length of the combination.

A mesa is formed by conventional lithography and etching. Fe-doped InP layer 17 and a n-InP layer 18 serve as current blocking layers. Numerals 19–21 refer to p-InP cladding layer, p⁺InGaAs layer cap layer, and p⁺InGaAs modulator cap layer, respectively. Trench 22 serves to electrically isolate the laser section from the modulator section. Conventional lair and modulator contacts are provided but are not shown. Other features of the I-MOD/DFB combination can be conventional. The combination is tested and performs as expected.

Figure 2:
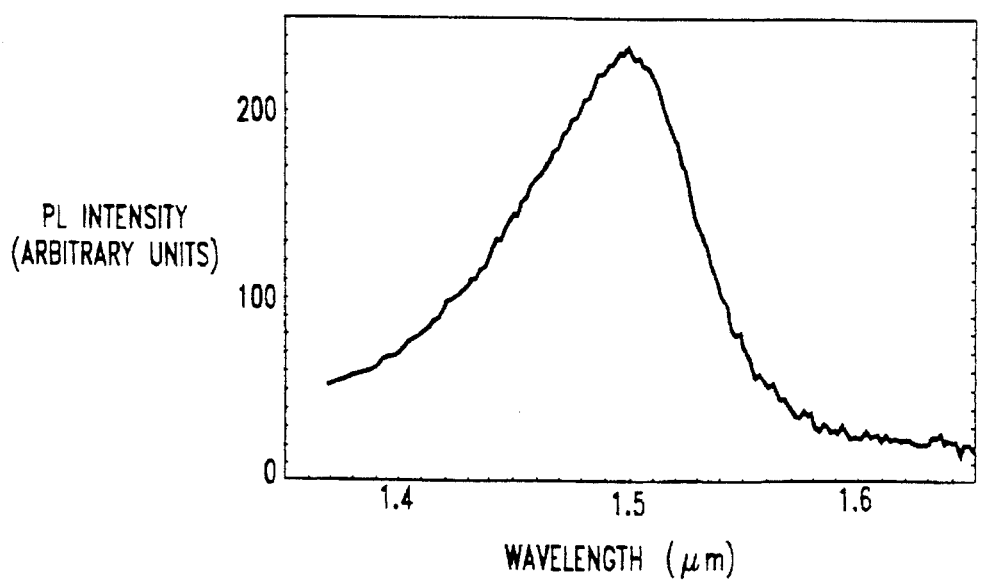
FIG. 2 shows exemplary data of photoluminescence intensity vs. wavelength.

FIG. 2 shows the photoluminescence spectrum of an exemplary laser active region (exemplarily strained layer MQW material), with peak wavelength $\lambda_o \sim 1.5$ µm. In preferred embodiments of the invention the distributed feedback element is selected to result in laser wavelength $\lambda_e > \lambda_o$. Typically, the element is a Bragg grating, and the grating period is selected to result in the desired value of $\lambda_e$. Determination of the period and fabrication of the grating can be conventional. Exemplarily the grating is selected such that $\lambda_e - \lambda_o$ is in the approximate range 20–70 nm, preferably about 50 nm. Such a choice will typically result in acceptable optical gain in the active region of the laser and, at the same time, in relatively small absorption in the unbiased modulator section.

Figure 3:
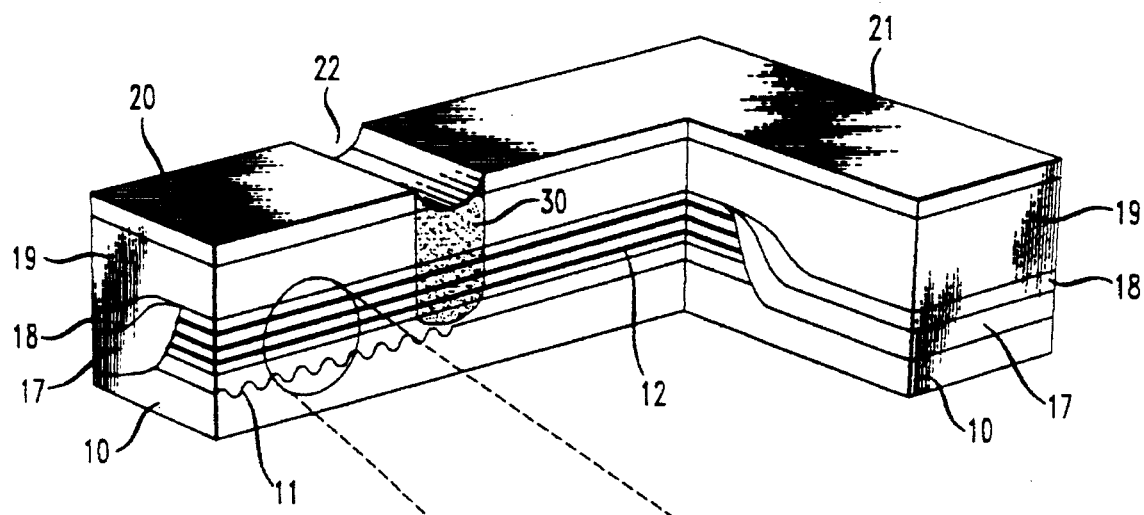
FIG. 3 depicts schematically a further exemplary I-MOD/DFB combination according to the invention.
Figure 3B:
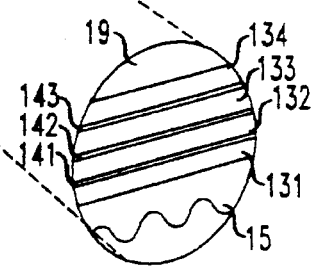

FIG. 3 shows an exemplary embodiment of the invention substantially as shown in FIG. 1, except that optical loss region 30 is provided. Exemplarily the loss region is formed by conventional ion implantation, and serves to introduce additional loss between the laser and modulator sections, such that back reflection into the laser from the output facet is reduced. Other means for introducing such loss are known (exemplarily provision of a reverse-biased section) and are contemplated.

Figure 4:
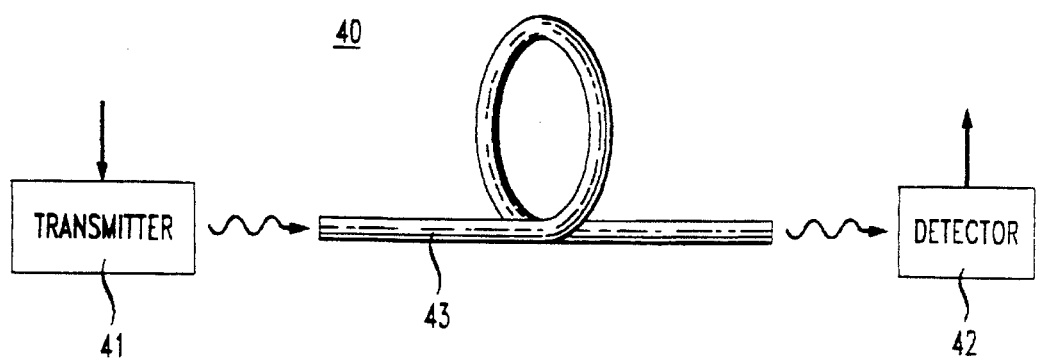
FIG. 4 schematically shows on optical fiber communication system that comprises a device combination according to the invention.

An I-MOD/DFB combination according to the invention exemplarily is incorporated into an optical fiber optical communication system 40, as schematically shown in FIG. 4, wherein numerals 41–43 refer, respectively, to an optical signal transmitter that comprises the I-MOD/DFB combination, an optical signal detector, and optical fiber that signal-transmissively connects the transmitter and the detector.

I claim:

1. An article comprising a semiconductor substrate and a semiconductor layer structure on the substrate, with said substrate and layer structure forming an integrated device combination comprising a laser section and a modulator section, the modulator section being aligned and optically coupled with the laser section, the article comprising laser contacts that facilitate flowing an electric current through the laser section, and further comprising modulator contacts that facilitate applying a voltage across the modulator section; said layer structure comprising an active region that comprises a first active region in the laser section and a second active region in the modulator section, associated with the first active region being a first bandgap energy $E_{g1}$, and associated with the second active region being a second bandgap energy $E_{g2}$; wherein a) the first active region is continuous with the second active region, and has the same number of layers, of the same layer thicknesses and compositions, as the second active region, such that $Eg_1 = E_{g2}$;

b) associated with the laser section is a gain peak wavelength $\lambda_o$, and the integrated device combination comprises a distributed feedback structure selected to result in a laser output wavelength $\lambda_e > \lambda_o$;

c) said first and second active regions each comprises a multiplicity of quantum wells of a first thickness, with a barrier layer of a second thickness separating any two adjacent quantum wells, wherein the second thickness is greater than the first thickness.

2. An article according to claim 1, wherein $\lambda_e - \lambda_o$ is in the approximate range 20–70 nm.

3. An article according to claim 1, wherein the distributed feedback structure is a Bragg grating.

4. An article according to claim 1, further comprising a loss region selected to provide at least partial isolation of the laser section from radiation reflected from an output facet of the integrated device combination.

5. An article according to claim 4, wherein said loss region is disposed between the laser section and the modulator section and comprises ion-implanted material.

6. An article according to claim 1, wherein the article is an optical fiber communication system comprising an optical signal transmitter, an optical signal detector, and optical fiber that signal-transmissively connects the transmitter and the detector, wherein said transmitter comprises said integrated device combination.

7. An article according to claim 6, wherein $\lambda_e$ is about 1.55 μm.

8. An article according to claim 1, wherein the active region is a quantum well active region that extends the length of the integrated device combination, and the second thickness is about 10 nm.

* * * * *